US009800141B2

(12) United States Patent
Henzler et al.

(10) Patent No.: US 9,800,141 B2
(45) Date of Patent: Oct. 24, 2017

(54) HYSTERETIC CURRENT CONTROL WITH EVENT DITHERING

(71) Applicant: Intel IP Corporation, Santa Clara, CA (US)

(72) Inventors: Stephan Henzler, Munich (DE); Christian Kranz, Ratingen (DE); Markus Hammes, Dinslaken (DE)

(73) Assignee: Intel IP Corporation, Santa Clara, CA (US)

( * ) Notice: Subject to any disclaimer, the term of this patent is extended or adjusted under 35 U.S.C. 154(b) by 304 days.

(21) Appl. No.: 14/643,239

(22) Filed: Mar. 10, 2015

(65) Prior Publication Data
US 2016/0268889 A1 Sep. 15, 2016

(51) Int. Cl.
| H02M 3/04 | (2006.01) |
| H03F 1/02 | (2006.01) |
| H02M 3/156 | (2006.01) |
| H02M 1/32 | (2007.01) |
| H02M 7/483 | (2007.01) |

(52) U.S. Cl.
CPC ............ H02M 3/04 (2013.01); H03F 1/0227 (2013.01); *H02M 1/32* (2013.01); *H02M 3/156* (2013.01); *H02M 2007/4835* (2013.01); *H03F 2200/102* (2013.01)

(58) Field of Classification Search
CPC ....................................................... H02M 3/04
See application file for complete search history.

(56) References Cited

U.S. PATENT DOCUMENTS 5,258,904 A 11/1993 de Benito et al.
6,067,490 A * 5/2000 Ichimaru .............. B60G 17/018
188/266.2
8,217,322 B2 * 7/2012 Houston .................. G05F 3/205
219/494
9,252,729 B2 2/2016 Lesso
2008/0278136 A1 11/2008 Murtojarvi
2011/0204802 A1 8/2011 Welten
2013/0193943 A1 8/2013 Wilson

OTHER PUBLICATIONS

European Search Report, Application No. EP 16152327.9-1805, Dated Aug. 9, 2016.
Yan-Fei Liu, et al.; "Digital Control of Switching Power Converters"; 2005 IEEE Conference on Control Applications; Aug. 28-31, 2005, p. 635-640.

* cited by examiner

*Primary Examiner* — Emily P Pham
(74) *Attorney, Agent, or Firm* — Eschweiler & Potashnik, LLC

(57) ABSTRACT

Systems and methods implementing dithered hysteretic current control are discussed. One system can include a switched-mode power supply, a control component, and a dither component. The control component can detect a crossing of a first threshold associated with a first mode of the switched-mode power supply, and generate first and second control signals, wherein the first control signal is based on the crossing of the first threshold. The dither component can receive the first control signal, delay the first control signal for a first random time period, and output the first control signal to the switched-mode power supply. The switched-mode power supply can receive the first control signal and the second control signal, switch from the first mode to a second mode based on the first control signal, and switch from the second mode to the first mode based on the second control signal.

25 Claims, 6 Drawing Sheets

HYSTERETIC CURRENT CONTROL WITH EVENT DITHERING

FIELD

The present disclosure relates to hysteretic current control (e.g., of switched-mode power supplies (e.g., AC-DC or DC-DC converters), etc.) in combination with event dithering, as well as to applications of event dithered hysteretic current control in connection with envelope tracking DC-DC converters.

BACKGROUND

One common application of switched-mode power supplies is DC-DC converters in wireless systems, such as in access points (e.g., E-nodeBs, etc.) or mobile devices (e.g., user equipment, etc.). An efficient way to optimize the power amplifier (PA) current consumption in a wireless system across the entire output power range is the use of a DC-DC converter to provide a variable PA supply voltage to a PA. Depending on the RF output power, for example, the output voltage of the DC-DC converter to the PA is adjusted. As the output power lowers, the PA supply voltage to the PA also lowers as a result. Due to a voltage conversion from the battery voltage down to the lower PA supply voltage, the battery current is reduced. Alternatively, the DC-DC converter output voltage can be fixed based on the target RF power (average RF power), which is expected in a next period of time. This procedure is sometimes called average power tracking (APT), in which a constant voltage is supplied to the PA.

Envelope tracking DC-DC (ET DC-DC) converters or envelope tracking modulators are capable of envelope tracking to further reduce the battery current in various situations. Envelope tracking describes an approach to RF amplifier operation, for example, in which the power supply voltage applied to the power amplifier is constantly adjusted to ensure that the amplifier is operating at or close to peak efficiency for the given instantaneous output power requirements.

A feature of envelope tracking is that the supply voltage of the power amplifier is not constant. The supply voltage of the power amplifier depends on the instantaneous envelope of the modulated baseband signal or radio frequency (RF) input signal, which is input into the PA. For example, an ET DC-DC converter follows the instantaneous envelope of the RF signal, which removes the voltage headroom and further increases the system efficiency (composite efficiency of the power amplifier and the DC-DC converter). An ET DC-DC converter, for example, can reduce the battery current of a Long Term Evolution (LTE) signal by roughly 20+% at maximum output power relative to a standard DC-DC converter, which simply follows an average power or a constant power supply.

DETAILED DESCRIPTION

Figure 1:
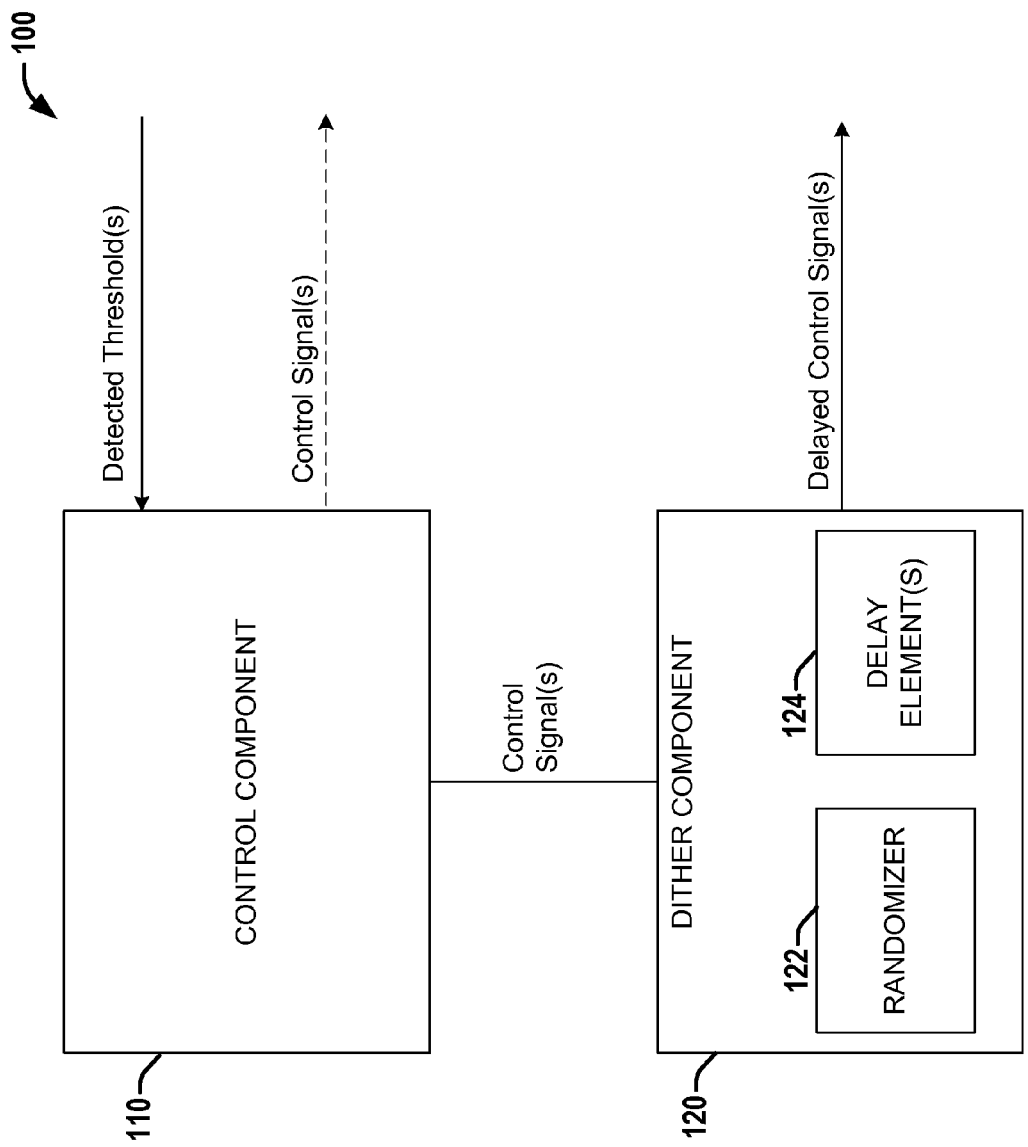
FIG. 1 is a block diagram illustrating a system or device that facilitates dithered hysteretic control according to various aspects described herein.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," and the like are intended to refer to a computer-related entity, hardware, software (e.g., in execution), and/or firmware. For example, a component can be a processor (e.g., a microprocessor, a controller, or other processing device), a process running on a processor, a controller, an object, an executable, a program, a storage device, a computer, a tablet PC and/or a mobile phone with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising."

Hysteretic current control can be employed in envelope tracking (ET) applications, and has no discrete spurs at multiples of the switching frequency when the signal varies strongly enough and quickly enough. However, for a constant envelope signal, for example, there would also be a constant switching frequency, which would be load dependent. According to various aspects described herein, hysteretic current control can be dithered, breaking limit cycles and spreading spurs that can occur during periods of low activity.

In hysteretic current control of a DC-to-DC converter, the coil current oscillates between an upper current limit and a lower current limit. To dither the current, the two current limits could be increased or decreased randomly. However, the analog generation and injection of the dither signal is difficult, complicating dithering of the current. Additionally, shaping of the dither signal (e.g., sigma delta dithering) is not feasible under practical power and area constraints.

However, in accordance with aspects described herein, the upper and lower current limits need not be modified at all. Instead, when the event(s) indicating the upper or current limits have been reached occur (e.g., threshold(s) crossed), the control signal(s) changing the mode of the DC-to-DC converter (e.g., from P-mode to N-mode or vice versa) can be randomly delayed. Thus, instead of dithering in the current domain, embodiments described herein can employ dithering in the time domain (event dithering). However, because the coil current changes effectively linearly for the time scales involved, there is a one-to-one relation between the current and the time domain. Thus, time-domain dithering as discussed herein has an equivalent effect to current-domain dithering.

Referring to FIG. 1, illustrated is a system or device 100 that facilitates dithered hysteretic control according to various aspects described herein. System 100 can include a control component 110 and a dither component 120. Control component 110 can be configured to monitor at least one property of at least one signal (e.g., an output voltage of a switched-mode power supply such as a DC-to-DC converter, etc.), and to detect a crossing of a first threshold associated with the at least one monitored signal. The crossing of the first threshold can comprise a voltage, current, clock frequency, etc. associated with the monitored at least one signal rising above or falling below a value of the first threshold (e.g., above an upper current threshold, below a lower current threshold, etc.). Based on the crossing of the first threshold, control component 110 can generate a first control signal.

Dither component 120 can be configured to receive the first control signal from control component 110. Dither component 120 can delay the first control signal by a first random time period, and can then output the first control signal. Randomizer 122 and one or more delay elements 124 can be included in dither component 120 to delay the first control signal by the first random time period (e.g., a first random number of clock cycles of a reference clock, etc.). Randomizer 122 (e.g., which can include any of a variety of randomization components, such as a linear shift register, etc.) can generate a random (which can include pseudo-random as used herein) number, signal, etc. that is output to the one or more delay elements 124. Based on the random number, signal, etc. received from randomizer 122, at least one of the one or more delay elements can be selected, and the first signal can be passed through the selected at least one delay element. In some embodiments, the one or more delay elements can each provide a comparable delay, in which case the first random time period can vary based on a number of delay elements selected. In other embodiments, the one or more delay elements can provide a plurality of delays (e.g., some shorter, some longer, etc.), in which case the first random time period can depend on which delay elements are selected and/or a number of delay elements selected. For example, dither component 120 can provide a random delay by selecting (e.g., at random) one out of a plurality of pre-defined delays. In the same or other embodiments, at least one of the delay elements can have a delay that can be randomly tuned. After being delayed by the first random time period, the output first control signal can be received by some circuit, device, component, etc., which can then begin operation in a second mode (e.g., a switched-mode power supply such as a DC-to-DC converter can switch from a first mode wherein a coil is charging to a second mode wherein a coil is discharging, vice versa, etc.). In aspects, dither component 120 can include a digital-to-time converter (DTC) (e.g., within the one or more delay elements 124) that can generate a variable delay based on a DTC input signal, which can be, for example, random or pseudo-random (e.g., generated by randomizer 122), correlated with (e.g., proportional to) a previous delay, etc., in accordance with aspects described herein.

The control component 110 can additionally generate a second control signal. In some aspects, the second control signal can be generated in a similar manner to the first control signal, for example, based on a detected crossing of a second threshold. Alternatively, the control component 110 can generate the second control signal a second time period after generating the first control signal (alternatively, the control component 110 can generate the second control signal immediately after the first control signal, and dither component 120 can delay the second control signal for the (fixed or variable) second time period). In some aspects, the second control signal can be output by the control component directly to the circuit, device, component, etc., while in other aspects the second control signal can be output to the dither component 120, which can output the second control signal after delaying the second control signal as described herein.

In some aspects wherein the second control signal is output to the dither component 120, dither component 120 can delay the second control signal by a second random time period (e.g., which can be determined similarly to the first random time period, etc.). In other aspects wherein the second control signal is output to the dither component 120, dither component 120 can delay the second control signal by an additional time period, for example, an additional time period based on the first random time period (e.g., correlated with it in some way, such as proportional to it, etc.), an additional random time period, etc. After any delaying of the second control signal, the dither component 120 can output the delayed second control signal.

In addition to the one or two threshold situations with a first (e.g., upper or lower) threshold and an optional second (e.g., lower or upper) threshold, aspects described herein can be employed in more complicated hysteretic control situations. For example, for hysteretic control of two or more variables, one or more regions (e.g., of allowed behavior, or prohibited behavior, etc.) can be defined in the resulting two or more dimensional space, and additional thresholds can be employed similarly to those described above. Alternatively, thresholds (and optionally control signals) can be defined based on functions of one or more variables, for example, a threshold of a maximum magnitude of a vector comprising two variables (e.g., I and Q components of a signal, etc.), with a control signal indicating sufficient information (e.g., a direction, etc.) to return the signal to the interior of an allowed region or the exterior of a prohibited region.

If the current were dithered directly, random variations could be either positive or negative deviations from the threshold value. Because the dithering is done in the time domain, negative deviations (e.g., negative delays) are not directly implementable. However, the same effect can be accomplished by offsetting thresholds from predefined values based on the delay (e.g., adjusting a first threshold from a predefined first threshold based on an average value of the first random time period, etc.). For example, instead of dithering allowing a ±5% variation in some threshold (e.g., with a threshold of 1 and a range of 1+x, with x randomly selected from numbers in the range of [−0.05, 0.05], giving values between 0.95 and 1.05), the threshold and the range of random variation can be adjusted to have the same output values (e.g., by adjusting the predefined threshold from 1 to 0.95 and having a range of 1+y, with y randomly selected from numbers in the range of [0, 0.1], again giving values between 0.95 and 1.05).

Additionally, in various aspects, some or all of the first threshold, the second threshold, and various time periods (e.g., first random time period, second random time period, etc.) can be adjusted to eliminate any bias in any circuit, device, component, etc. controlled by system 100. For example, when system 100 applies hysteretic current control to a switched-mode power supply such as a DC-to-DC converter, the first threshold can be an upper current limit, and the second threshold when used can be a lower current limit (alternatively, a second time period can be used). Based on the value of the first threshold, the average value of the first random time period, the value of the second threshold and the average value of the second random time period, an average current value can be determined as a bias of the switched-mode power supply. Some or all of the threshold values or average values of time periods can be adjusted to eliminate the determined bias of the switched-mode power supply. Alternatively, a similar technique can be employed in connection with the value of the first threshold, the average value of the first random time period, the value of the second time period (as adjusted by any additional time period (random or not), etc.).

Figure 2:
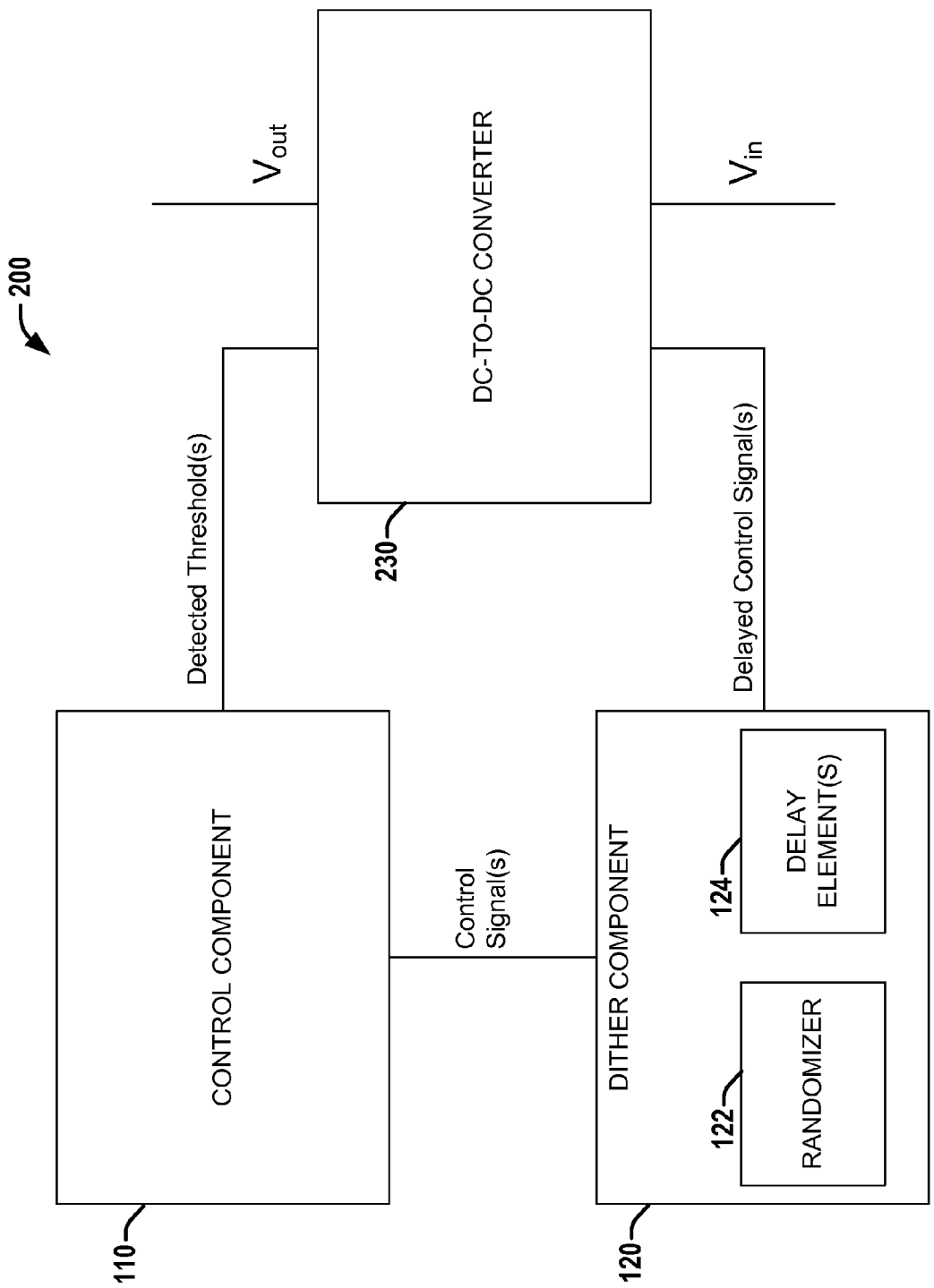
FIG. 2 is a block diagram illustrating a system or device that facilitates dithered hysteretic current control of a direct current (DC)-to-DC converter according to various aspects described herein.

Referring to FIG. 2, illustrated is a system or device 200 that facilitates dithered hysteretic current control of a DC-to-DC converter 230 according to various aspects described herein (in various embodiments, other switched-mode power supplies (e.g., an AC-DC converter) can be employed in a similar manner to that described in connection with the DC-DC converter 230 of FIG. 2). The control component 110 and the dither component 120 can operate as described elsewhere herein.

Control component 110 can monitoring a voltage, current, etc. of the DC-to-DC converter 230, determine a crossing of a first (and optionally second) threshold, and can generate a first control signal when the monitored voltage, current, etc. goes above (or below) a first threshold. In aspects with a second threshold, control component 110 can generate a second control signal when the monitored voltage, current, etc. goes below (or above) the second threshold. In other aspects, control component 110 can generate the second control signal after the second time period. In aspects, control component 110 can determine crossings of the first (and optionally second) threshold by monitoring an output voltage of the DC-to-DC converter 230.

Dither component 120 can receive the first control signal and delay it for a first random time period, and can optionally delay the second control signal according to various aspects described herein. After any delaying, each control signal received by the dither component 120 can be output to the DC-to-DC converter 230.

DC-to-DC converter 230 can receive an input voltage and generate an output voltage based at least in part on switching between operation according to a first mode (e.g., a P-mode, wherein an inductor is charging, or an N-mode, wherein an inductor is discharging) and operation according to a second mode (e.g., whichever of the P-mode or the N-mode does not correspond to the first mode). Upon receiving the first control signal, DC-to-DC converter 230 can switch from the first mode to the second mode, and upon receiving the second control signal, DC-to-DC converter 230 can switch from the second mode to the first mode. Thus, control component 110 can switch DC-to-DC converter 230 via hysteretic control (or a combination of hysteretic control in connection with the first threshold and operation in the second mode for the second time period). In various applications, e.g., when DC-to-DC converter 230 is an envelope tracking (ET) DC-to-DC converter (or in other radio frequency (RF) applications, etc.), dither component 120 can provide dithering in the time domain to eliminate unwanted periodic behavior of DC-to-DC converter 230 (e.g., during periods of low activity). In embodiments in which DC-to-DC converter 230 is an ET DC-to-DC converter, DC-to-DC converter 230 can provide a supply voltage that depends upon the envelope of the RF signal as the output voltage. In some aspects, this can include the supply voltage tracking the instantaneous envelope of the RF signal, but it can also include aspects wherein not just the instantaneous envelope is considered (e.g., to combat memory effects, the supply voltage can depend on previous or later samples of the envelope), and the envelope need not be directly tracked (e.g., only tracked down to a minimum level, for example, to avoid non-linear behavior or because power consumption is already low enough).

Figure 3A:
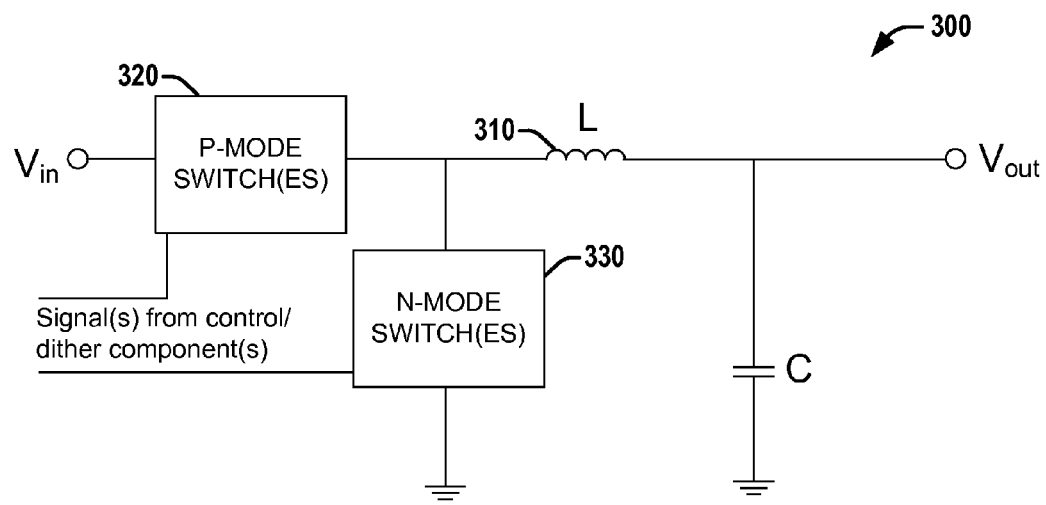
FIG. 3A is a block diagram illustrating an example DC-to-DC converter employable in connection with various aspects described herein.

Referring to FIG. 3A, illustrated is a block diagram of an example DC-to-DC converter 300 employable in connection with various aspects described herein (e.g., as DC-to-DC converter 130, etc.). DC-to-DC converter 300, an example of a synchronous buck converter useable in connection with embodiments discussed herein, is provided solely for the purposes of illustration, and it is to be understood that embodiments discussed herein can provide dithered hysteretic control for a range of circuits, devices, components, etc., including various types of switched-mode power supplies other than DC-to-DC converter 300.

Control component 110, not shown in FIG. 3A, can monitor the current through inductor 310, for example, by measuring the voltage drop in the switch devices (e.g., one or more P-mode switches 320, one or more N-mode switches 330, etc.) of DC-to-DC converter 300. Alternatively, the current can be measured by sensing the voltage drop in a sense resistor. In an alternative implementation example, the current threshold can be detected by using a replica device with forced current and sensing of the voltage drops. In the P-mode (which is referred to herein as the first mode, although in various aspects, the N-mode can be the first mode and the P-mode can be the second mode), the P-mode switch(es) 320 can be on, connecting the input ($V_{in}$) to the output ($V_{out}$) across inductor 310, charging inductor 310. When a crossing of a first threshold is detected (e.g., reaching an upper current limit $I_{upper}$ when the P-mode is the first mode, although in other embodiments it could be reaching a lower current limit $I_{lower}$, etc.), control component 110 can generate a first control signal, dither component 120 can delay the first control signal, and output it to DC-to-DC converter 300. In response, DC-to-DC converter 300 can switch to operation in a second mode (e.g., N-mode, wherein the inductor 310 is discharging, etc.), such as by switching off the P-mode switch(es) 320, and switching on the N-mode switch(es) 330. In the second mode (e.g., N-mode), the N-mode switches 330 are on, connecting coil 310 between ground and the output ($V_{out}$). When the second control signal is received by DC-to-DC converter 300 (e.g., sent after the second time period, or based on a crossing of a second threshold (e.g., $I_{lower}$), with any delaying by dither component 120), DC-to-DC converter 300 can switch to operation in the first mode (e.g., P-mode), such as by switching off the N-mode switch(es) 330, and switching on the P-mode switch(es) 320, and the process can repeat, with DC-to-DC converter 300 switching between the first mode and the second mode.

Figure 3B:
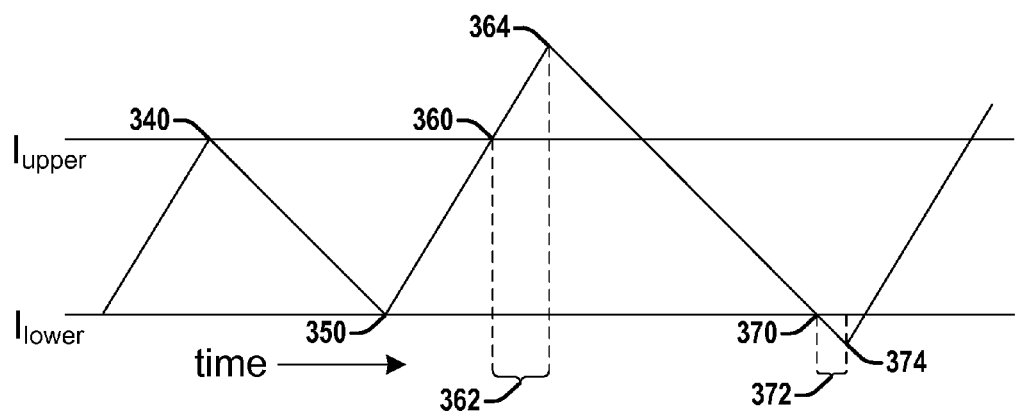
FIG. 3B is a graph illustrating current as a function of time in a DC-to-DC converter according to various aspects described herein.

FIG. 3B illustrates a graph of current as a function of time in a DC-to-DC converter according to various aspects described herein. On the left of FIG. 3B, hysteretic control without dithering is shown, while in the middle and on the right of FIG. 3B, dithered hysteretic control is shown. At the left of the graph, the DC-to-DC converter can be operating according to a P-mode (e.g., first mode), wherein a coil is charging and the current through the coil is increasing. At 340, a crossing of a first threshold ($I_{upper}$) is detected, and a first control signal is sent, which causes the DC-to-DC converter to switch to an N-mode (e.g., second mode), wherein the coil is discharging and the current through the coil is decreasing. This can continue until a second threshold is reached (or for a second time period) at 350, when a second control signal is generated, and the DC-to-DC converter switches back to operation in the P-mode (e.g., first mode). From the left side of FIG. 3B through 340 and 350 shows hysteretic control without dithering.

From 350, with the DC-to-DC converter operating in the P-mode, the current can rise until it again reaches the first threshold at 360, at which point the first control signal can be generated (e.g., by control component 110). However, the first control signal is delayed by a first random time period 362 before being received by the DC-to-DC converter at 364. During the first random time period 362, the coil current continues to rise, as seen in FIG. 3B, until the control signal is received by the DC-to-DC converter at 364 and the DC-to-DC converter switches to the N-mode. As the coil current decreases, it reaches the second threshold 370, at which point the second control signal is generated. However, the second control signal is delayed (in the example shown in FIG. 3B) by a second random time period 372 before being received by the DC-to-DC converter 374, which switches to the P-mode in response (in other embodiments, the second control signal can be generated or received by the DC-to-DC converter after the second period of time instead of being generated based on the crossing of the second threshold). As can be seen in FIG. 3B, by randomly delaying the first (and optionally second) control signal(s), the upper current limit can be randomly increased and the lower current limit can be randomly decreased, facilitating the same effect as dithering in the current domain (above the first threshold or below the second threshold). Through adjustment of the first threshold and either the second threshold or the second period of time, dithering in the other directions can also be facilitated. For example, switching to the N-mode for random values above or below a first predefined threshold can be accomplished by adjusting the first threshold to be lower than the first predefined threshold, and switching to the P-mode for random values above or below a second predefined threshold can be accomplished by adjusting the second threshold to be higher than the second predefined threshold (or switching earlier than a second predefined time period can be accomplished by adjusting the second time period to be shorter than the second predefined time period).

Figure 4:
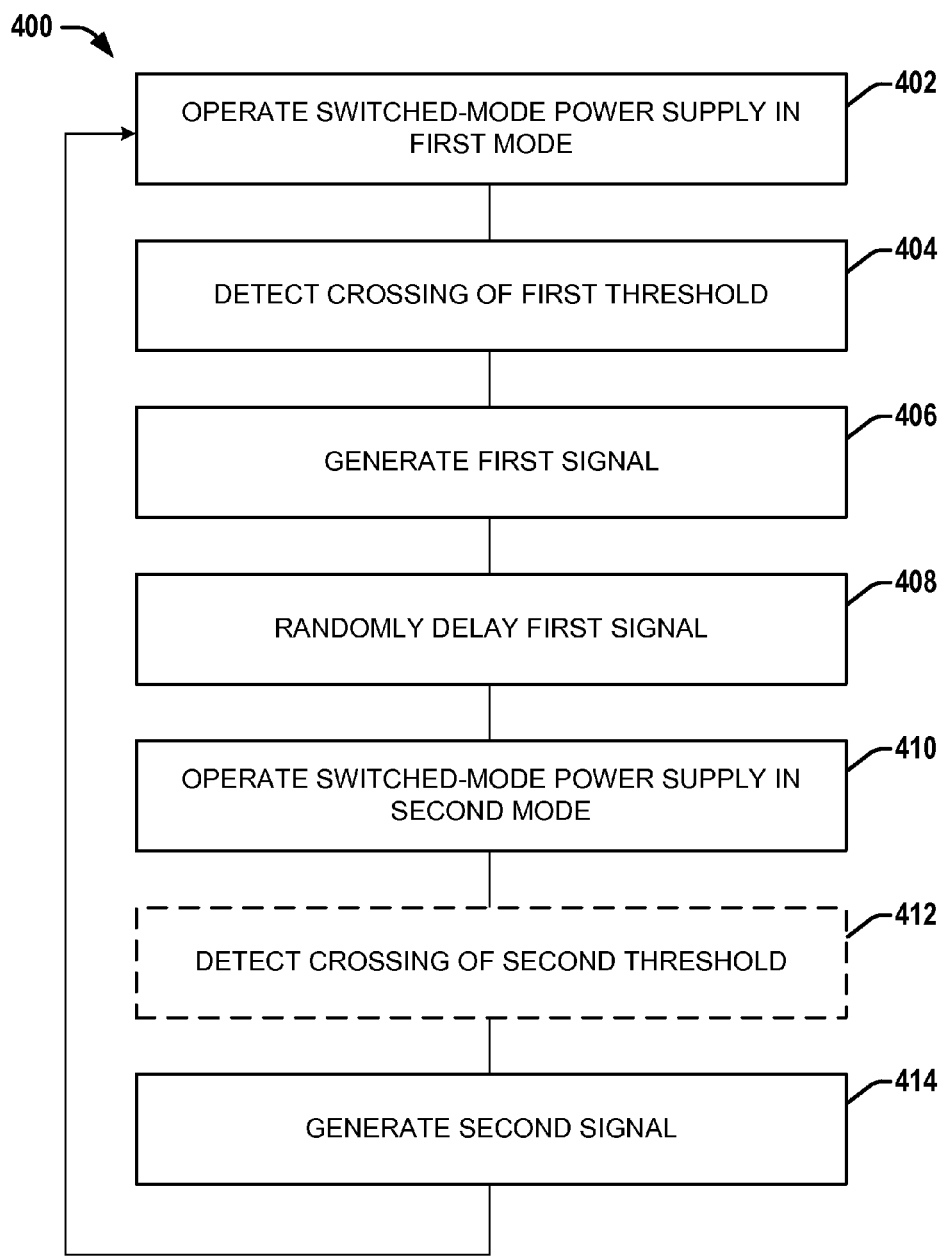
FIG. 4 is a flow diagram illustrating a method that facilitates dithered hysteretic control according to various aspects described herein.

Referring to FIG. 4, illustrated is a flow diagram of a method 400 that facilitates dithered hysteretic control according to various aspects described herein. Method 400 can include, at 402, operating a switched-mode power supply such as a DC-to-DC converter in a first mode. For ease of discussion, the switched-mode power supply is a DC-to-DC converter and the first mode as used in the discussion of method 400 refers to a P-mode wherein an inductor of the DC-to-DC converter is charging, although in various embodiments, various types of switched-mode power supplies could be used, and the first mode could refer to a distinct mode (e.g., N-mode). At 404, a crossing of a first threshold associated with the first mode is detected (e.g., a coil current reaching an upper current threshold $I_{upper}$). Based on the detected crossing of the first threshold, a first control signal is generated at 406. At 408, the first control signal is randomly delayed by a first random time period (e.g., via randomly selecting delay elements of longer or shorter delays and/or randomly selecting more or less delay elements, etc.). At 410, the switched-mode power supply receives the first control signal and begins operating according to a second mode of operation (e.g., N-mode) in response to the first control signal. In some aspects, a crossing of a second threshold associated with the second mode (e.g., a coil current reaching a lower current threshold $I_{lower}$) is detected at 412, causing a second control signal to be generated based at least in part on the crossing of the second threshold at 414. In other aspects, the second control signal can be generated at 414 after a second period of time, or can be generated immediately and delayed (e.g., via a dither component 120) for a second period of time. Upon the switched-mode power supply receiving the second control signal (e.g., which can be delayed, but need not be, etc.), method 400 can return to 402, wherein the switched-mode power supply can resume operation according to the first mode (e.g., P-mode) in response to the second control signal.

Dithered hysteretic current control as described herein has multiple applications and advantages. As discussed herein, dithering can be employed for switched-mode power supplies such as DC-to-DC converters in applications such as envelope tracking (e.g., to avoid spurs during periods of low activity, etc.). Additionally, event (e.g., time domain) dithering as discussed herein can be employed as a differentiator. Embodiments discussed herein can be readily implemented with low area and power requirements, and can be widely tuned. Error introduced by dithering discussed herein can be considered in digital control algorithms for error feedback. Dithering discussed herein can be white or noise shaped, as noise shaping can be readily accomplished in the digital domain. Additionally, embodiments discussed herein can accommodate a wide tuning range, programmability, and can be adapted to a range of operating conditions.

Figure 5:
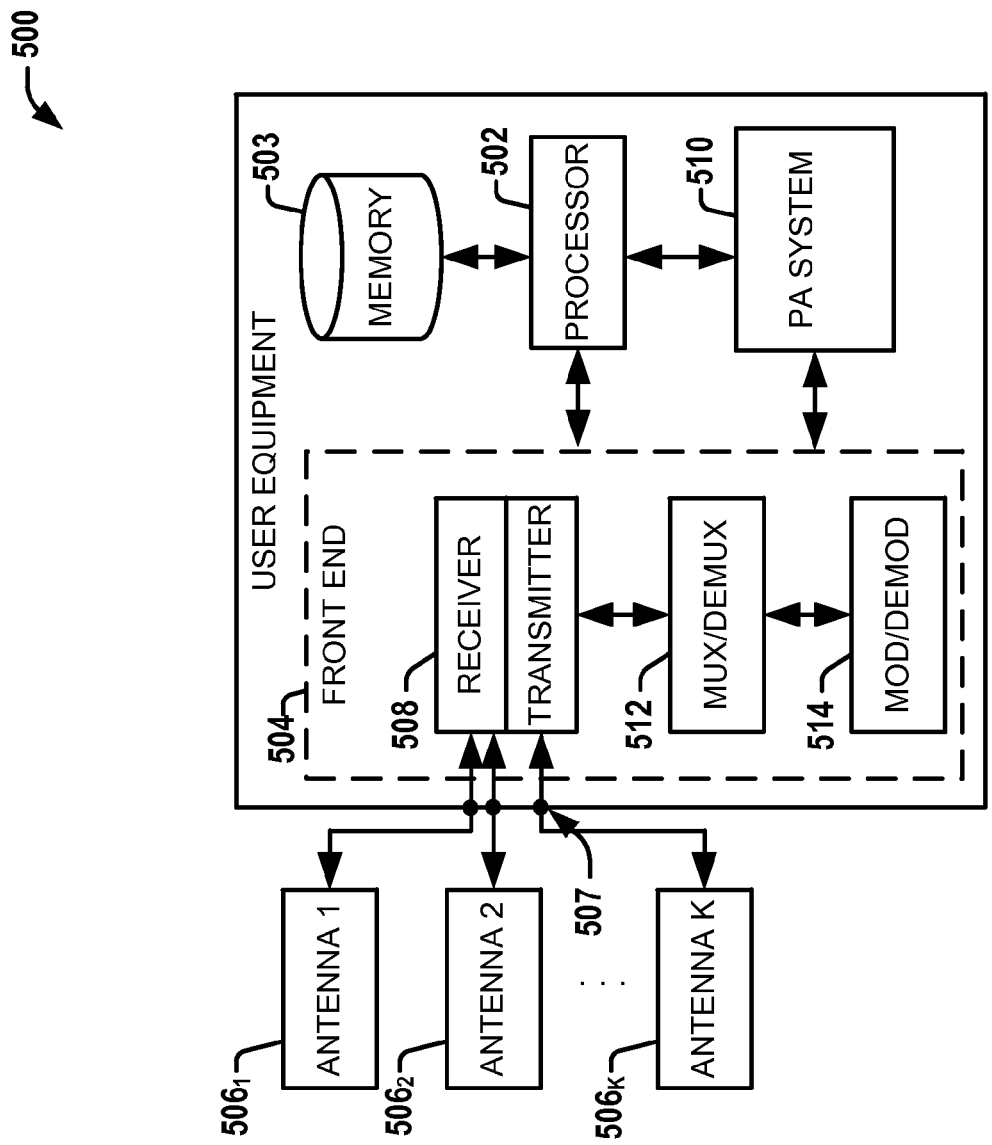
FIG. 5 is a block diagram illustrating an example user equipment useable in connection with various aspects described herein.

Referring to FIG. 5, illustrated is an exemplary user equipment or mobile communication device 500 that can be utilized with one or more aspects of the systems, methods, or devices that facilitate envelope tracking described herein according to various aspects. The user equipment 500, for example, comprises a digital baseband processor 502 that can be coupled to a data store or memory 503, a front end 504 (e.g., an RF front end, an acoustic front end, or the other like front end) and a plurality of antenna ports 507 for connecting to a plurality of antennas $506_1$ to $506_k$ (k being a positive integer). The antennas $506_1$ to $506_k$ can receive and transmit signals to and from one or more wireless devices such as access points, access terminals, wireless ports, routers and so forth, which can operate within a radio access network or other communication network generated via a network device. The user equipment 500 can be a radio frequency (RF) device for communicating RF signals, an acoustic device for communicating acoustic signals, or any other signal communication device, such as a computer, a personal digital assistant, a mobile phone or smart phone, a tablet PC, a modem, a notebook, a router, a switch, a repeater, a PC, network device, base station or a like device that can operate to communicate with a network or other device according to one or more different communication protocols or standards.

The front end 504 can include a communication platform, which comprises electronic components and associated circuitry that provide for processing, manipulation or shaping of the received or transmitted signals via one or more receivers or transmitters 508, a mux/demux component 512, and a mod/demod component 514. The front end 504, for example, is coupled to the digital baseband processor 502 and the set of antenna ports 507, in which the set of antennas $506_1$ to $506_k$ can be part of the front end. In one aspect, the user equipment 500 can comprise a PA system 510 that operates with a delay component for providing a delay between a main signal processing path and an envelope tracking path of a PA. The delay can be dynamically (re-)calibrated according to a feedback path from the PA output, for example. In aspects, PA system 510 can comprise a DC-DC converter or system employing hysteretic current control as described herein that can facilitate dithering of at least one delay associated with at least one threshold.

The user equipment 500 can also include a processor 502 or a controller that can operate to provide or control one or more components of the user equipment 500. For example, the processor 502 can confer functionality, at least in part, to substantially any electronic component within the user equipment 500, in accordance with aspects of the disclosure. As an example, the processor can be configured to execute, at least in part, executable instructions that control various modes of the PA system 510 as a multi-mode operation chipset that affords different power generation operations for input signals at the antenna ports 507, an input terminal or other terminal based on one or more characteristics of the input signal.

The processor 502 can operate to enable the mobile communication device 500 to process data (e.g., symbols, bits, or chips) for multiplexing/demultiplexing with the mux/demux component 512, or modulation/demodulation via the mod/demod component 514, such as implementing direct and inverse fast Fourier transforms, selection of modulation rates, selection of data packet formats, inter-packet times, etc. Memory 503 can store data structures (e.g., metadata), code structure(s) (e.g., modules, objects, classes, procedures, or the like) or instructions, network or device information such as policies and specifications, attachment protocols, code sequences for scrambling, spreading and pilot (e.g., reference signal(s)) transmission, frequency offsets, cell IDs, and other data for detecting and identifying various characteristics related to RF input signals, a power output or other signal components during power generation.

The processor 502 is functionally and/or communicatively coupled (e.g., through a memory bus) to memory 503 in order to store or retrieve information necessary to operate and confer functionality, at least in part, to communication platform or front end 504, the PA system 510 and substantially any other operational aspects of the PA system 510. The PA system 510 includes at least one power amplifier in the RF front end 504 that can employ an envelope tracking mode of operation in order to improve an efficiency or battery life of the user equipment 500. While the components in FIG. 5 are illustrated in the context of a user equipment, such illustration is not limited to user equipment but also extends to other wireless communication devices, such as base station, small cell, femtocell, macro cell, microcell, etc.

Figure 6:
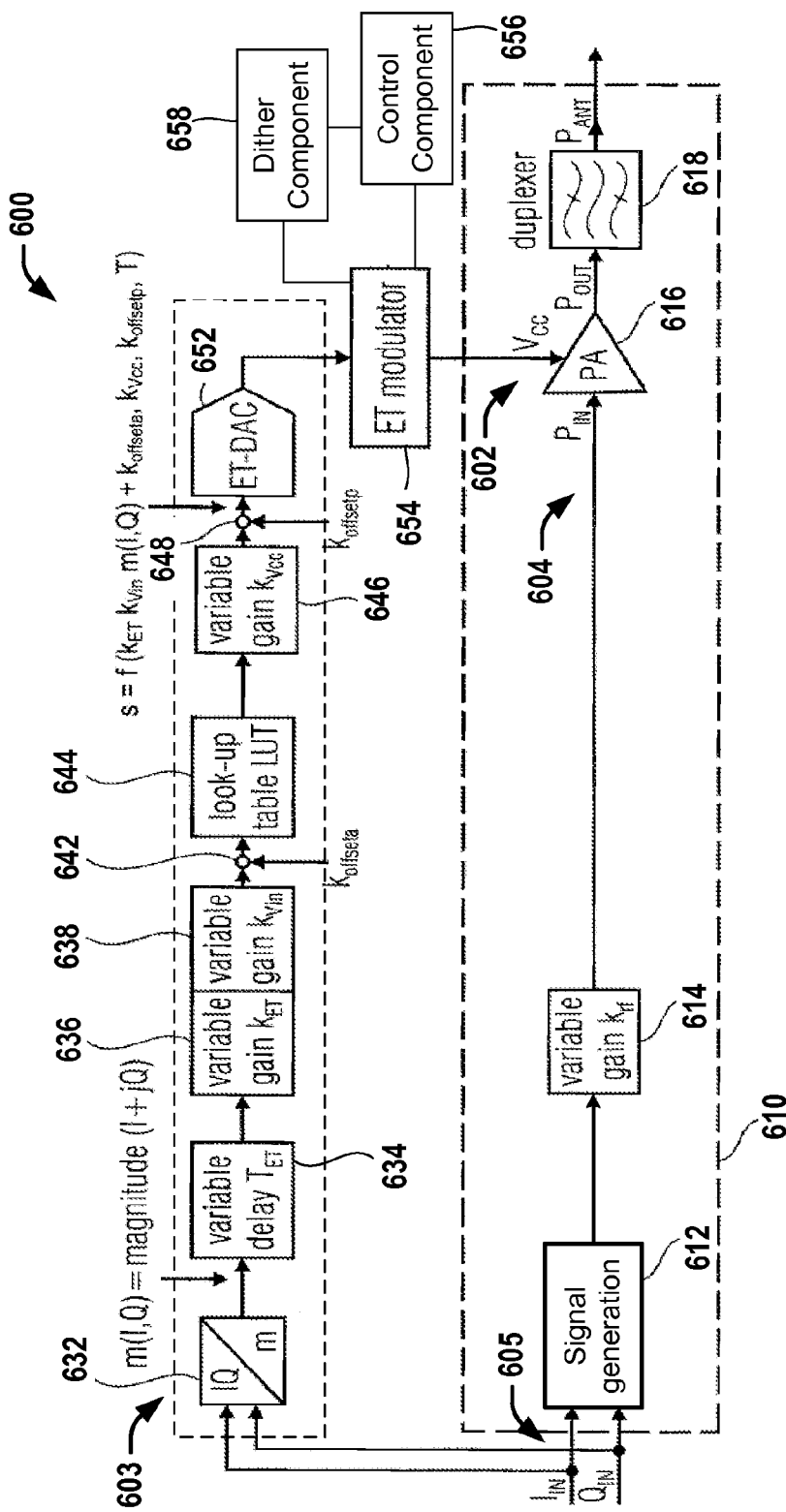
FIG. 6 is a block diagram illustrating a power amplifier (PA) capable of operating in an ET mode in connection with various aspects described herein.

Referring to FIG. 6, illustrated is a schematic block diagram of an envelope tracking system 600 with a power amplifier 616 that has an input terminal 602 that is part of an envelope tracking pathway 603 and an input terminal 604 that is part of a signal generation pathway 610. An input terminal 605 or an input signal 605 (e.g., a differential signal, a single ended signal, an RF signal, an acoustic signal, or other like communication signal) to be processed or transmitted, can comprise, for example, an in-phase component $I_{IN}$ and a quadrature component $Q_{IN}$. Alternatively or additionally, the input signal 605 can comprise a different format as a single or a differential signal. The input signal 605 is received by a signal generation path 610 that comprises an RF signal generation component 612, a variable gain element 614, a power amplifier (PA) 616, and a duplexer 618. The signal generation component 612 can be configured to perform frequency up-conversion, for example, from a baseband (BB) frequency range to a radio frequency range, or generate a different conversion operation, such as a digital-to-analog conversion of the input signal 605. The variable gain element 614 is configured to multiply an output of the signal generation component 612 with a variable gain (e.g., $k_{rf}$) that serves to achieve a desired gain setting of the entire signal generation path 614 as part of the power amplifier system 600. The power amplifier 616 amplifies the signal provided by the variable gain element 614, wherein an input power of the PA 616 is $P_{IN}$ and an output power is $P_{OUT}$. The amplified amplifier output signal (Pout) is then fed to the duplexer 618, which separates transmitted and received signals in the frequency domain. At an antenna port of the duplexer 618, the output signal is typically slightly attenuated to an antenna power $P_{ANT}$, compared to the output power $P_{OUT}$ of the power amplifier 616.

One envelope tracking specific design target on a system level is a flat AMPM- and AMAM phase response of the PA 616 versus PA supply voltage $V_{CC}$ and across output power (in this context PA supply voltage $V_{CC}$ refers to the voltage that is influenced by an envelope tracking operation, for example, the supply voltage of a $2^{nd}$ PA stage). The abbreviation AMPM stands for "amplitude-to-phase distortion" and the abbreviation AMAM stands for "amplitude-to-amplitude distortion".

The lookup table 644 can be part of the envelope tracking path 603 or a supply voltage processing path, which is depicted above the main signal generation path 610. The supply voltage processing path 603 is also considered a part of the envelope tracking system 600. The supply voltage processing path 603 can comprise a vector-to-magnitude converter 632 (e.g., implementing a CORDIC algorithm, etc.). The instantaneous magnitude of the input signal 605 can be expressed as m(I,Q)=magnitude(I+JQ), which is forwarded to a variable delay element 634 configured to delay the magnitude signal by a delay $T_{ET}$ to aid in synchronizing the variation in $V_{CC}$ with the envelope of the RF signal in the signal generation path 610. The supply voltage processing path 603 further comprises a variable gain element 636 with a variable gain $k_{ET}$. The variable gain $k_{ET}$ can be synchronized with the variable gain $k_{rf}$ of the transmitter (not explicitly shown in FIG. 6). At a summing element 642, an input signal offset $k_{offseta}$ is added before the signal is provided to a lookup table (LUT) 644. The lookup table 644 implements a nonlinear transfer function or at least the basic shape of the nonlinear transfer function. The supply voltage processing path 603 further comprises a further variable gain element 646 for applying a variable gain $k_{VCC}$ to an output signal of the lookup table 644. At a further summing element 648 an output signal offset $k_{offsetp}$ is added before the signal is digital-to-analog converted by an envelope tracking digital-to-analog converter (ET-DAC) 652. An analog output signal of the ET-DAC 652 is provided to the ET modulator 654 (e.g., ET DC-DC voltage provider) as a variable or dynamic control signal and to cause the ET modulator 654 to provide a corresponding supply voltage $V_{CC}$ to the envelope tracking power amplifier 616 for providing an output voltage or output power signal at a maximum efficiency. A switching frequency of the ET modulator 654 can be controlled via hysteretic current control by a control component 656, which can detect a crossing of a first and/or second current threshold (e.g., upper and/or lower current threshold(s)) based on an output voltage of the ET modulator 654. Based on detected crossing(s) of the threshold(s), control component 656 can generate associated control signal(s), which can be received by dither component 658. Dither component 658 can apply a random, etc. delay to at least one control signal (e.g., a first control signal and/or a second control signal) and can provide the delayed control signal(s) to ET modulator 654, which can switch modes (e.g., from a P-mode to an N-mode, vice versa, etc.) in response to receiving the delayed control signal(s).

The delay of the delay component 634 can be sensitive to part-to-part variations along the main signal processing path 610 and the envelope tracking path 603, as well as to aging and PVT dependencies, for example. Therefore, the delay is calibrated during production of the power amplifier system 600 or of a communication device/transmitter/receiver/ transceiver that comprises the power amplifier system 600. In one aspect, re-calibration is dynamic and can be facilitated by the power system 600 after production on-the-fly or in real-time during an active transmission or during active communications of the device in the field during an active transmission mode or an active mode of operation in order to compensate for the aging effects, PVT dependencies, or other variations.

In some instances, the variable delay may only be calibrated once during factory calibration for a 50 ohm termination. However, factory calibration has different limitations as follows: (1) the delay might change over time, and (2) the factory calibration process does not fully reflect real-life use cases of a mobile device (e.g., the antenna impedance does change depending on the position of the mobile communication device relative to the mobile device user). Antenna impedance change can also affect the PA behavior (e.g., for some antenna impedances the PA supply $V_{CC}$ has to be increased to maintain antenna output power and for other antenna impedances the PA supply Vcc needs to be decreased to reach the same output power). As a result, the actual delay or actual delay function of the delay component 634 is subject to deviate from a target delay that was established during factory calibration in a calibration mode, for example, which is different from an active transmission mode in the field or thereafter. As such, these variations can cause degradation of an adjacent channel leakage ratio (ACLR) or an error vector magnitude (EVM) performance, for example. These conditions discussed above can be mitigated or avoided by dynamically re-adjusting the delay or the delay function of the delay component $T_{ET}$ 634 according to various aspects described.

Several measures can be carried out to compensate possible delay changes. The power amplifier system 600 can perform dynamic calibration or setting of the delay component 634 in the envelope tracking path 603 according to 1) a re-calibration during an active transmission or an active power generation mode of the power amplifier during operation, 2) on-the-fly re-calibration without interfering with the information inherent in the received input signal 605 (e.g., an RF signal, acoustic signal or the like), or 3) on-the-fly re-calibration without violation of the spectral mask of the input signal 605. In aspects, the subject innovation can provide such an ET mode over each (or some, in other aspects) frequency band, facilitating ET mode in connection with simultaneous transmission in one or more frequency bands.

Examples herein can include subject matter such as a method, means for performing acts or blocks of the method, at least one machine-readable medium including executable instructions that, when performed by a machine (e.g., a processor with memory or the like) cause the machine to perform acts of the method or of an apparatus or system for concurrent communication using multiple communication technologies according to embodiments and examples described.

Example 1 is a system that facilitates dithered hysteretic current control, comprising a switched-mode power supply, a control component, and a dither component. The switched-mode power supply is configured to receive an input voltage and to generate an output voltage therefrom based at least in part on switching between a first operation according to a first mode and a second operation according to a second mode. The control component is configured to detect a crossing of a first threshold associated with the first mode and to generate a first control signal based at least in part on the crossing of the first threshold, and to generate a second control signal. The dither component is configured to receive the first control signal, to delay the first control signal for a first random time period, and to output the first control signal to the switched-mode power supply. Additionally, the switched-mode power supply is configured to receive the first control signal and the second control signal, to switch from the first mode to the second mode based at least in part on the first control signal, and to switch from the second mode to the first mode based at least in part on the second control signal.

Example 2 includes the subject matter of example 1, wherein the control component is configured to detect a crossing of a second threshold associated with the second mode, and wherein the control component is configured to generate the second control signal based at least in part on the detected crossing of the second threshold.

Example 3 includes the subject matter of example 2, wherein the dither component is configured to receive the second control signal, to delay the second control signal for a second random time period, and to output the second control signal to the switched-mode power supply.

Example 4 includes the subject matter of example 3, wherein the first random time period and the second random time period are correlated.

Example 5 includes the subject matter of any of examples 2-4, including or omitting optional features, wherein a value of the first threshold, a value of the second threshold, and an average value of the first random time period eliminate an average bias of the switched-mode power supply.

Example 6 includes the subject matter of example 1, wherein the control component is configured to generate the second control signal in a second time period after the control component generates the first control signal.

Example 7 includes the subject matter of example 6, wherein the dither component is configured to receive the second control signal, to delay the second control signal by an additional time period based at least in part on the first random time period, and to output the second control signal to the switched-mode power supply.

Example 8 includes the subject matter of any of examples 6-7, including or omitting optional features, wherein the dither component is configured to receive the second control signal, to delay the second control signal by a second random time period, and to output the second control signal to the switched-mode power supply.

Example 9 includes the subject matter of any of examples 1-8, including or omitting optional features, wherein the dither component comprises a plurality of delay elements, wherein the dither component is configured to delay the first control signal by the first random time period based at least in part on passing the first control signal through a randomly selected number of delay elements of the plurality of delay elements.

Example 10 includes the subject matter of any of examples 9, including or omitting optional features, wherein the delay of at least one of the plurality of delay elements is configured to be randomly tuned.

Example 11 includes the subject matter of any of examples 1-10, including or omitting optional features, wherein the dither component comprises a digital-to-time converter configured to delay the first control signal for the first random time period.

Example 12 includes the subject matter of any of examples 1-11, including or omitting optional features, wherein the dither component randomly selects one out of a plurality of pre-defined delays to delay the first control signal for the first random time period.

Example 13 includes the subject matter of any of examples 1-12, including or omitting optional features, wherein the switched-mode power supply comprises a DC-to-DC converter configured to receive an envelope tracking (ET) control signal based on a radio frequency (RF) signal, and wherein the DC-to-DC converter is configured to generate a supply voltage that depends upon the envelope of the RF signal as the output voltage.

Example 14 includes the subject matter of example 2, wherein a value of the first threshold, a value of the second threshold, and an average value of the first random time period eliminate an average bias of the switched-mode power supply.

Example 15 includes the subject matter of example 1, wherein the control component is configured to generate the second control signal a second time period after the control component generates the first control signal.

Example 16 includes the subject matter of example 15, wherein the dither component is configured to receive the second control signal, to delay the second control signal by an additional time period based at least in part on the first random time period, and to output the second control signal to the switched-mode power supply.

Example 17 includes the subject matter of example 15, wherein the dither component is configured to receive the second control signal, to delay the second control signal by a second random time period, and to output the second control signal to the switched-mode power supply.

Example 18 includes the subject matter of example 1, wherein the dither component comprises a plurality of delay elements, wherein the dither component is configured to delay the first control signal by the first random time period based at least in part on passing the first control signal through a randomly selected number of delay elements of the plurality of delay elements.

Example 19 includes the subject matter of example 18, wherein the delay of at least one of the plurality of delay elements is configured to be randomly tuned.

Example 20 includes the subject matter of example 1, wherein the dither component comprises a digital-to-time converter configured to delay the first control signal for the first random time period.

Example 21 includes the subject matter of example 1, wherein the dither component randomly selects one out of a plurality of pre-defined delays to delay the first control signal for the first random time period.

Example 22 includes the subject matter of example 1, wherein the dither component comprises a plurality of delay elements, wherein the dither component is configured to delay the first control signal by the first random time period based at least in part on passing the first control signal through a randomly selected delay element of the plurality of delay elements, wherein at least two of the plurality of delay elements are configured to delay the first control signal for distinct delay times.

Example 23 includes the subject matter of example 1, wherein the switched-mode power supply comprises a DC-to-DC converter configured to receive an envelope tracking (ET) control signal based on a radio frequency (RF) signal, and wherein the DC-to-DC converter is configured to generate a supply voltage that depends upon the envelope of the RF signal as the output voltage.

Example 24 is a system that facilitates dithered hysteretic control, comprising a control component and a dither component. The control component is configured to detect a crossing of a first threshold and to generate a first control signal based at least in part on the crossing of the first threshold. The dither component is configured to receive the first control signal, to delay the first control signal for a first random time period, and to output the first control signal.

Example 25 includes the subject matter of example 24, wherein the control component is further configured to generate a second control signal.

Example 26 includes the subject matter of example 25, wherein the control component is configured to detect a crossing of a second threshold and to generate the second control signal based at least in part on the detected crossing of the second threshold.

Example 27 includes the subject matter of example 26, wherein the dither component is configured to receive the second control signal, to delay the second control signal for a second random time period, and to output the second control signal.

Example 28 includes the subject matter of example 25, wherein the control component is configured to generate the second control signal in a second time period after the control component generates the first control signal.

Example 29 includes the subject matter of example 28, wherein the dither component is configured to receive the second control signal, to delay the second control signal by an additional time period based at least in part on the first random time period, and to output the second control signal.

Example 30 includes the subject matter of any of examples 24-29, including or omitting optional features, wherein the dither component comprises a plurality of delay elements, wherein the dither component is configured to delay the first control signal by the first random time period based at least in part on passing the first control signal through a randomly selected number of delay elements of the plurality of delay elements.

Example 31 includes the subject matter of example 24, wherein the dither component comprises a plurality of delay elements, wherein the dither component is configured to delay the first control signal by the first random time period based at least in part on passing the first control signal through a randomly selected number of delay elements of the plurality of delay elements.

Example 32 includes the subject matter of example 24, wherein the dither component is configured to delay the first control signal by a random number of clock cycles of a reference clock.

Example 33 includes the subject matter of example 24, wherein the dither component comprises a plurality of delay elements, wherein the dither component is configured to delay the first control signal by the first random time period based at least in part on passing the first control signal through a randomly selected delay element of the plurality of delay elements, wherein at least two of the plurality of delay elements are configured to delay the first control signal for distinct delay times.

Example 34 is a method of dithering a switching frequency between a first mode and a second mode. The method includes operating a switched-mode power supply according to the first mode; detecting a crossing of a first threshold associated with the first mode; generating a first control signal based at least in part on the crossing of the first threshold; delaying the first control signal for a first random time period; operating the switched-mode power supply according to the second mode in response to the delayed first control signal; generating a second control signal; and operating the switched-mode power supply according to the first mode in response to the second control signal.

Example 35 includes the subject matter of example 34, further comprising detecting a crossing of a second threshold, wherein the second control signal is generated based at least in part on the detected crossing of the second threshold.

Example 36 is a system that facilitates dithered hysteretic current control, comprising: means for supplying power, means for controlling, and means for dithering. The means for supplying power is configured to receive an input voltage and to generate an output voltage therefrom based at least in part on switching between a first operation according to a first mode and a second operation according to a second mode. The means for controlling is configured to detect a crossing of a first threshold associated with the first mode and to generate a first control signal based at least in part on the crossing of the first threshold, and to generate a second control signal. The means for dithering is configured to receive the first control signal, to delay the first control signal for a first random time period, and to output the first control signal to the means for supplying power. Additionally, the means for supplying power is configured to receive the first control signal and the second control signal, to switch from the first mode to the second mode based at least in part on the first control signal, and to switch from the second mode to the first mode based at least in part on the second control signal.

Example 37 is a system that facilitates dithered hysteretic control, comprising means for controlling and means for dithering. The means for controlling is configured to detect a crossing of a first threshold and to generate a first control signal based at least in part on the crossing of the first threshold. The means for dithering is configured to receive the first control signal, to delay the first control signal for a first random time period, and to output the first control signal.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations. In addition, while a particular feature may have been disclosed with respect to only one of several implementations, such feature may be combined with one or more other features of the other implementations as may be desired and advantageous for any given or particular application.

What is claimed is:

1. A system that facilitates dithered hysteretic current control, comprising:
  a switched-mode power supply configured to receive an input voltage and to generate an output voltage therefrom based at least in part on switching between a first operation according to a first mode and a second operation according to a second mode;
  a control component configured to detect a crossing of a first threshold associated with the first mode and to generate a first control signal based at least in part on the crossing of the first threshold, and to generate a second control signal; and a dither component configured to receive the first control signal, to delay the first control signal for a first random time period to generate a delayed first control signal, and to output the delayed first control signal to the switched-mode power supply, wherein the switched-mode power supply is configured to receive the delayed first control signal and the second control signal, to switch from the first mode to the second mode based at least in part on the delayed first control signal, and to switch from the second mode to the first mode based at least in part on the second control signal.

2. The system of claim 1, wherein the control component is configured to detect a crossing of a second threshold associated with the second mode, wherein the control component is configured to generate the second control signal based at least in part on the detected crossing of the second threshold.

3. The system of claim 2, wherein the dither component is configured to receive the second control signal, to delay the second control signal for a second random time period, and to output the second control signal to the switched-mode power supply.

4. The system of claim 3, wherein the first random time period and the second random time period are correlated.

5. The system of claim 2, wherein a value of the first threshold, a value of the second threshold, and an average value of the first random time period eliminate an average current bias of the switched-mode power supply.

6. The system of claim 1, wherein the control component is configured to generate the second control signal in a second time period after the control component generates the first control signal.

7. The system of claim 6, wherein the dither component is configured to receive the second control signal, to delay the second control signal by an additional time period based at least in part on the first random time period, and to output the second control signal to the switched-mode power supply.

8. The system of claim 6, wherein the dither component is configured to receive the second control signal, to delay the second control signal by a second random time period, and to output the second control signal to the switched-mode power supply.

9. The system of claim 1, wherein the dither component comprises a plurality of delay elements, wherein the dither component is configured to delay the first control signal by the first random time period based at least in part on passing the first control signal through a randomly selected number of delay elements of the plurality of delay elements.

10. The system of claim 9, wherein the delay of at least one of the plurality of delay elements is configured to be randomly tuned.

11. The system of claim 1, wherein the dither component comprises a digital-to-time converter configured to delay the first control signal for the first random time period.

12. The system of claim 1, wherein the dither component randomly selects one out of a plurality of pre-defined delays to delay the first control signal for the first random time period.

13. The system of claim 1, wherein the dither component comprises a plurality of delay elements, wherein the dither component is configured to delay the first control signal by the first random time period based at least in part on passing the first control signal through a randomly selected delay element of the plurality of delay elements, wherein at least two of the plurality of delay elements are configured to delay the first control signal for distinct delay times.

14. The system of claim 1, wherein the switched-mode power supply comprises a DC-to-DC converter configured to receive an envelope tracking (ET) control signal based on a radio frequency (RF) signal, and wherein the DC-to-DC converter is configured to generate a supply voltage that depends upon the envelope of the RF signal as the output voltage.

15. A system that facilitates dithered hysteretic control, comprising:
a control component configured to detect a crossing of a first threshold and to generate a first control signal based at least in part on the crossing of the first threshold; and
a dither component configured to receive the first control signal, to delay the first control signal for a first random time period to generate a delayed first control signal, and to output the delayed first control signal.

16. The system of claim 15, wherein the control component is further configured to generate a second control signal.

17. The system of claim 16, wherein the control component is configured to detect a crossing of a second threshold and to generate the second control signal based at least in part on the detected crossing of the second threshold.

18. The system of claim 17, wherein the dither component is configured to receive the second control signal, to delay the second control signal for a second random time period, and to output the second control signal.

19. The system of claim 16, wherein the control component is configured to generate the second control signal in a second time period after the control component generates the first control signal.

20. The system of claim 19, wherein the dither component is configured to receive the second control signal, to delay the second control signal by an additional time period based at least in part on the first random time period, and to output the second control signal.

21. The system of claim 15, wherein the dither component comprises a plurality of delay elements, wherein the dither component is configured to delay the first control signal by the first random time period based at least in part on passing the first control signal through a randomly selected number of delay elements of the plurality of delay elements.

22. The system of claim 15, wherein the dither component is configured to delay the first control signal by a random number of clock cycles of a reference clock.

23. The system of claim 15, wherein the dither component comprises a plurality of delay elements, wherein the dither component is configured to delay the first control signal by the first random time period based at least in part on passing the first control signal through a randomly selected delay element of the plurality of delay elements, wherein at least two of the plurality of delay elements are configured to delay the first control signal for distinct delay times.

24. A method of dithering a switching frequency between a first mode and a second mode, comprising:
operating a switched-mode power supply according to the first mode;
detecting a crossing of a first threshold associated with the first mode;
generating a first control signal based at least in part on the crossing of the first threshold;
delaying the first control signal for a first random time period to generate a delayed first control signal;

operating the switched-mode power supply according to the second mode in response to the delayed first control signal;
generating a second control signal; and
operating the switched-mode power supply according to the first mode in response to the second control signal.

25. The method of claim 24, further comprising detecting a crossing of a second threshold, wherein the second control signal is generated based at least in part on the detected crossing of the second threshold.

* * * * *